United States Patent
Gindele et al.

(10) Patent No.: US 12,369,442 B2
(45) Date of Patent: Jul. 22, 2025

(54) PACKAGED OPTOELECTRIC MODULES WITH NITRIDE CERAMIC FRAMES AND GLASS ELEMENT HERMETICALLY CLOSING THE FRAMES

(71) Applicant: SCHOTT AG, Mainz (DE)

(72) Inventors: Frank Gindele, Schweitenkirchen (DE); Christian Rakobrandt, Schwindegg (DE); Alexander Neumeier, Moosburg/Aich (DE); Robert Hettler, Kumhausen (DE)

(73) Assignee: SCHOTT AG, Mainz (DE)

( * ) Notice: Subject to any disclaimer, the term of this patent is extended or adjusted under 35 U.S.C. 154(b) by 172 days.

(21) Appl. No.: 17/363,227

(22) Filed: Jun. 30, 2021

(65) Prior Publication Data
US 2021/0408344 A1  Dec. 30, 2021

(30) Foreign Application Priority Data
Jun. 30, 2020 (DE) ............ 10 2020 117 186.2

(51) Int. Cl.
*H10H 20/85* (2025.01)
*H10H 20/825* (2025.01)
(Continued)

(52) U.S. Cl.
CPC ........ *H10H 20/854* (2025.01); *H10H 20/825* (2025.01); *H10H 20/8506* (2025.01); *H10H 20/8581* (2025.01)

(58) Field of Classification Search
CPC ........... H01L 33/483; H01L 2933/0033; H01L 33/56; H01L 23/15; H01L 2933/005;
(Continued)

(56) References Cited

U.S. PATENT DOCUMENTS 5,466,488 A * 11/1995 Toyoda ............... C04B 41/89
427/377
2006/0180909 A1  8/2006 Kim
(Continued)

FOREIGN PATENT DOCUMENTS

CN     205406561 U * 7/2016
JP     2014201452 A * 10/2014
(Continued)

OTHER PUBLICATIONS

Heraeus, Properties of fused silica.*
(Continued)

*Primary Examiner* — David Chen
(74) *Attorney, Agent, or Firm* — Ruggiero McAllister & McMahon LLC

(57) ABSTRACT

A stable, hermetically sealed, partially optically transparent package for use to protect optoelectronic components is provided. The package has good cooling for the installed circuit elements and is as stable in relation to temperature and UV. The package has a cap with a frame made of a nitride ceramic and a glass element. The frame has an opening and the glass element hermetically closes the opening. The glass is fused onto the nitride ceramic and is fixed in contact with the nitride ceramic of the frame.

16 Claims, 4 Drawing Sheets

(51) Int. Cl.
  *H10H 20/854* (2025.01)
  *H10H 20/858* (2025.01)

(58) Field of Classification Search
  CPC ....... H01L 33/641; H01L 33/32; H01L 23/10;
       H01L 23/04; C03C 8/24; C03C 27/00;
       C03C 17/04; H10H 20/854; H10H
       20/825; H10H 20/8581; H10H 20/036;
       H10H 20/8506
  USPC ......... 257/433, 680, 794, E23.009, E31.117;
       438/FOR. 378; 501/32
  See application file for complete search history.

(56) References Cited

U.S. PATENT DOCUMENTS

| | | | | |
|---|---|---|---|---|
| 2012/0067085 | A1* | 3/2012 | Yamaguchi | C03C 27/00 |
| | | | | 65/36 |
| 2012/0074443 | A1* | 3/2012 | Li | H01L 33/58 |
| | | | | 257/98 |
| 2012/0286319 | A1* | 11/2012 | Lee | H01L 33/642 |
| | | | | 257/E33.062 |
| 2017/0047542 | A1* | 2/2017 | Dejneka | C03C 3/064 |
| 2018/0040777 | A1 | 2/2018 | Matsui | |
| 2019/0074416 | A1 | 3/2019 | Kobayashi | |
| 2019/0122945 | A1 | 4/2019 | Shiragami | |
| 2021/0382251 | A1* | 12/2021 | Ordonez Orellana | |
| | | | | G02B 6/4237 |

FOREIGN PATENT DOCUMENTS

| | | |
|---|---|---|
| JP | 2017073489 | 4/2017 |
| WO | 2017027676 | 2/2017 |
| WO | 2017132489 | 8/2017 |

OTHER PUBLICATIONS

Aluminum Nitride Ceramic Products, Alfa Aesar by Thermo Fisher Scientific.*
CN-205406561-U English Machine Translation (Year: 2016).*

* cited by examiner

100 μm

20 μm

PACKAGED OPTOELECTRIC MODULES WITH NITRIDE CERAMIC FRAMES AND GLASS ELEMENT HERMETICALLY CLOSING THE FRAMES

CROSS REFERENCE TO RELATED APPLICATIONS

This application claims benefit under 35 USC § 119 of German Application 10 2020 117 186.2 filed Jun. 30, 2020, the entire contents of which are incorporated herein by reference.

BACKGROUND

1. Field of the Invention

The invention relates in general to optoelectronic modules, such as in particular optoelectronic transducers for generating or registering light or other electromagnetic radiation. In particular, the invention relates to the formation of a package of such modules.

2. Description of the Related Art

Particularly UV LED modules, especially in the UVB and UVC range, require materials and construction and connection techniques which are stable in relation to the radiation generated and also withstand demanding environmental conditions. Typical LED modules made of polymers or made of plastic-overmolded metal parts only limitedly satisfy these requirements. For example, yellowing of the materials by the UV radiation takes place. Besides the material stability, in the case of packages that are not gas-tight, the risk arises that the sensitive LED chip will be damaged or destroyed by the atmosphere or contamination. A hermetic package therefore enormously increases the stability and reliability of the LED module.

US 2019/0122945 A1 describes a method for providing aluminum nitride with a glass layer. A glass cover is likewise provided with a layer. The two layers are then brought into contact and connected using a laser, whereby hermetic closure of the two parts takes place. This process is firstly elaborate and cost-intensive.

JP 2017/073489 A describes a hermetic package for UV LEDs, in which the cap of the LED module consists entirely of glass and is partially coated. The connection of the cap to the substrate is carried out by anodic bonding.

US 2006/180909 describes a rectangular cap with curved corners, the frame of the cap consisting of Kovar or another metal.

SUMMARY

The object of the invention is to construct a stable, hermetically sealed, partially optically transparent cap for use to protect optoelectronic components, with which good cooling for the installed circuit elements is obtained and which is as stable as possible in relation to temperature and UV.

Accordingly, a cap for the package of an optoelectronic component is provided, comprising a frame made of a nitride ceramic, which has an opening, and a glass element which hermetically closes the opening, is fused onto the nitride ceramic and is fixed in contact with the nitride ceramic of the frame. There is thus a direct connection of the glass to the ceramic. The connection to the aluminum nitride ceramic, formed by fusing in the glass element, can readily be verified in the microscope image. Because of the fusion, the glass exactly follows the surface fine structure of the nitride ceramic. This applies, because of the fusion generated by the softening of the entire glass element, to the entire interface between glass and nitride ceramic. Because of the complementary surface shapes along the entire interface, a good form fit and therefore very strong interlocking of the glass element with the ceramic are achieved.

Particularly good fixing is achieved by the glass element being fused into the opening of the frame and connected to the inner wall of the opening, so that the inner wall of the frame fully encloses the glass element annularly, or according to the geometry of the frame, i.e. on its circumference, and hermetically seals the transition between the frame and the glass element. In particular, an open cavity may be formed on an inner side of the glass element in the cap, in order to enclose the circuit element or elements of an optoelectronic component formed with the cap.

With this configuration, a hermetic connection of the glass element to a nitride ceramic is possible without intermediate layers or further measures. Since an intermediate layer does not need to be present, a direct interface is formed between the glass and the nitride ceramic. The glass at the interface is then also in this case the same as the glass in the middle or in the volume of the glass element.

Particularly preferably, the frame contains aluminum nitride. This material has a high thermal conductivity, but on the other hand is not electrically conductive. In general, nitride ceramics are chemically very inert, so that it is surprising to achieve a stable connection between glass and ceramic since chemical bonding is not to be expected. In particular, it is surprising with an associated or expected low wettability of glass and AlN.

It has been found that the connection takes place even if the contact angle of the ceramic with the glass is more than 90°. In this case, the ceramic behaves like a superphobic material in relation to the glass of the glass element.

According to a further aspect of the invention, the optoelectronic component encapsulated with the cap according to this disclosure is also provided. The component comprises a carrier and at least one electronic circuit element fastened on the carrier, for example a photosensitive or light-emitting structure and/or a structure consisting of photosensitive and/or light-emitting elements, the cap being placed on the carrier and connected thereto, so that the electronic circuit element is enclosed and hermetically encapsulated in the cavity formed between the cap and the carrier. In this case, the glass element forms a translucent window to the cavity, in order to introduce or extract light.

It is particularly advantageous for the carrier like the frame of the cap to comprise nitride ceramic, or to be made of nitride ceramic. This allows excellent heat dissipation from the part and at the same time avoids thermal stresses between the frame and the carrier. This naturally applies particularly when the frame and the carrier are made of the same material in order to achieve matching of the thermal expansion coefficients. Preferably, the frame and the carrier comprise aluminum nitride. According to a further embodiment, a ceramic-metal structure is envisioned for the carrier. For example, the carrier may be constructed in two levels or layers, with a nitride ceramic level or layer on which the electronic circuit element is arranged, and a metal level or layer. The metal level or layer may provide further improved heat dissipation.

BRIEF DESCRIPTION OF FIGURES

The invention will be explained in more detail below more accurately and with reference to the figures.

DETAILED DESCRIPTION

Figure 1:
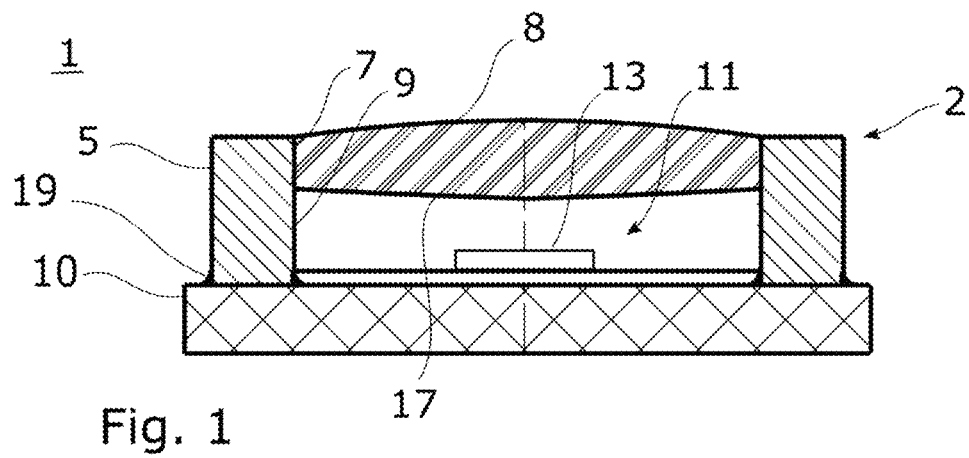
FIGS. 1-2 each show a sectional view of an optoelectronic component.
Figure 2:
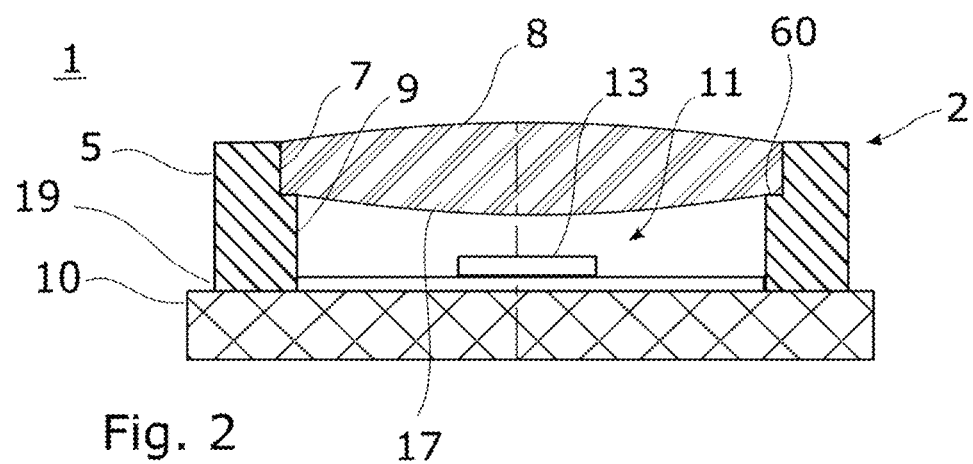

FIG. 1 shows an optoelectronic component 1 in a sectional view. The component 1 comprises a cap 2 having a frame 5 made of a nitride ceramic, which has an opening 7, and a glass element 8 which hermetically closes the opening 7, is fused onto the nitride ceramic and is fixed in contact with the nitride ceramic of the frame 5. According to FIG. 2, the frame 5 has a shoulder 60 on its inner circumference, into which the glass element 8 can be placed, wherein the depth of the shoulder may also be configured to be less than the thickness of the glass element. Accordingly, in one embodiment, without restriction to the specific configuration of the example of FIG. 2, it is provided that the frame has a shoulder 60 or a step, onto which the glass element 8 can be placed and which is therefore in contact with the glass element 8 after the fusion.

Figure 3:
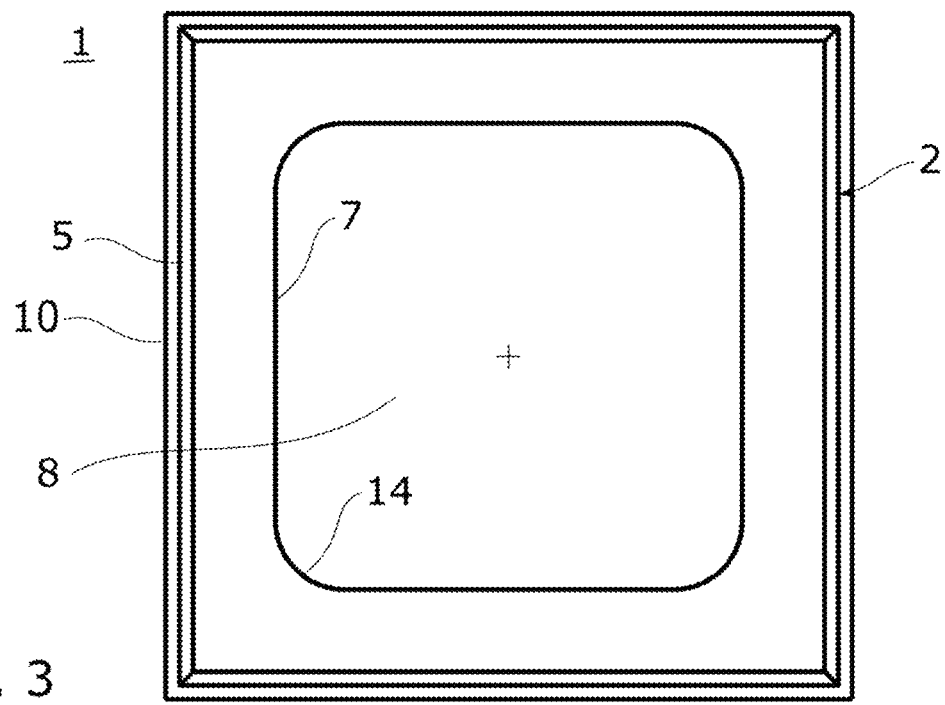
FIG. 3 shows a plan view of the optoelectronic component according to FIG. 1.

As in the represented example of FIG. 1 and FIG. 3, it is preferred for an open cavity 11 to be formed in the cap 2 on an inner side 17 of the glass element 8. The electronic circuit element 13 then protrudes into this cavity 11.

The component 1 furthermore has a carrier 10 and at least one electronic circuit element 13 fastened on the carrier 10, the cap 2 being placed on the carrier 10 and connected thereto, so that the electronic circuit element 13 is enclosed and hermetically encapsulated in a cavity 11 formed between the cap 2 and the carrier 10. According to one preferred embodiment, the electronic circuit element 13 may be a UV light-emitting diode. Accordingly, in this case the component 1 is a packaged light-emitting diode for emitting UV light. The structure described here is advantageous particularly for UV light-emitting diodes since the efficiency of the light-emitting diodes is only low (typically 1-2%), so that the light-emitting diodes become very hot.

A good connection of the frame 5 and the glass element 8 is achieved in particular when the glass element 8 is fused into the opening 7 of the frame 5 and is connected to the inner wall 9 of the opening 7, so that the inner wall 9 of the frame 5 encloses the glass element 8 annularly and hermetically seals the transition between the frame 5 and the glass element 8. It is also possible in particular to produce the connection between the frame and the glass element without intermediate materials. Accordingly, it is provided that a direct interface 57 is formed between the glass of the glass element 8 and the nitride ceramic.

Figure 4:
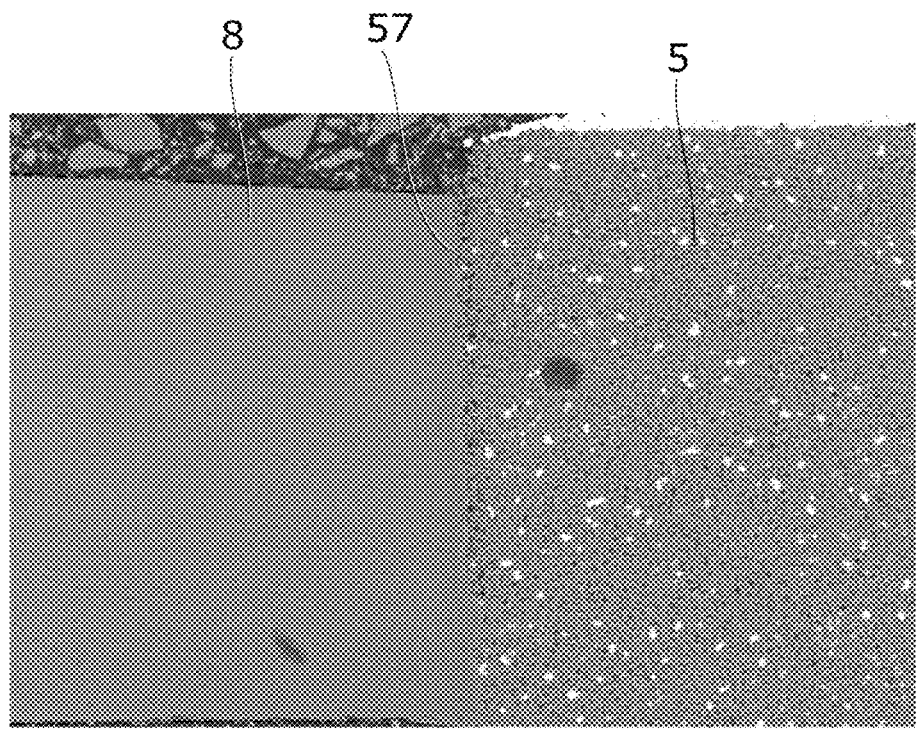
FIGS. 4-6 show electron microscopy images of the region of the interface between the frame and the glass element.
Figure 5:
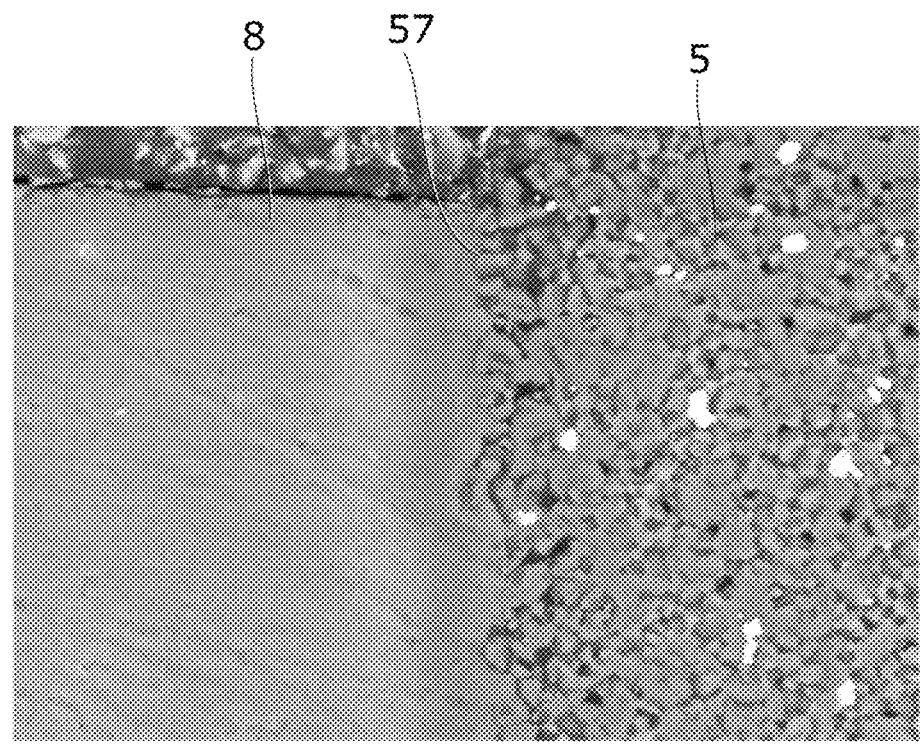
Figure 6:
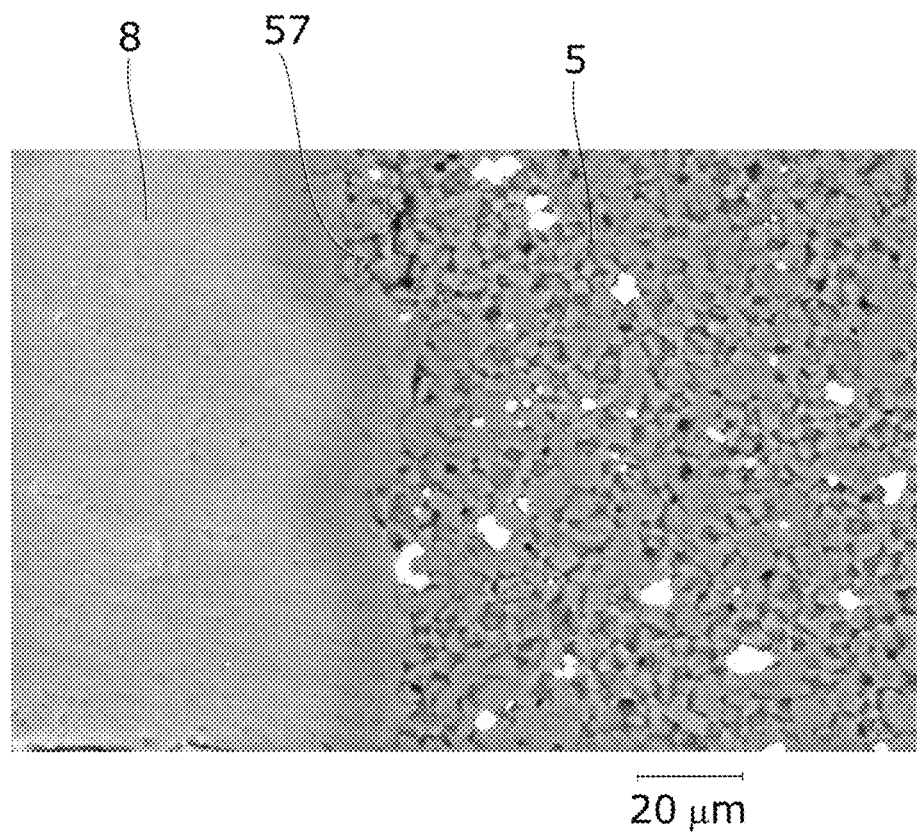

FIG. 4, FIG. 5 and FIG. 6 in this regard show electron microscopy images of the region of the interface between the frame 5 and the glass element 8 at different magnifications. As is preferred, the frame 5 of this example consists of aluminum nitride. The scale is respectively represented in the bars below the images. The granular structure of the aluminum nitride ceramic may be seen clearly. No transition region is to be seen at the interface 57. This indicates that a reaction or mixing does not take place between the nitride ceramic of the frame 5 and the glass of the glass element 8 at the interface, so that a sharp interface is formed, or the glass and the aluminum nitride ceramic are adjacent to one another without a transition. Surprisingly, it has been found that this can be influenced by means of the composition of the glass of the glass element 8, and in particular glasses containing bismuth may in this case be disadvantageous for intimate interlocking at the interface 57 between the glass element 8 and the frame 5. According to one embodiment, it is therefore also provided that the glass of the glass element has a bismuth content of less than 5 wt %, preferably less than 2 wt %, or is even free of bismuth, at least at the interface 57 with the frame 5. The figures also show that glass and nitride ceramic bear on one another along the entire interface on account of the fusion of the glass element as a result of a softening of the entire glass element. Therefore, in one embodiment, it is generally also provided that the surfaces of glass and nitride ceramic bear on one another and have a complementary fine structure along the entire interface 57 between the glass of the glass element 8 and the nitride ceramic of the frame 5. This also differentiates the interface for instance from a laser-joined connection. In the case of such a connection, the material is fused only locally, for instance along a joining line. The nitride ceramic preferably has at least a granularity with an average grain diameter in the range of from 1 to 10 μm. This leads to a surface that is rough enough to anchor the glass element firmly. On the other hand, the grains are still small enough to provide a dense composition for hermetic enclosure of the electronic circuit element or elements.

In general, without restriction to the example shown in FIG. 1 and FIG. 3, in one refinement of the optoelectronic component described here, it is provided that the carrier 10 also comprises nitride ceramic in order to achieve good heat dissipation from the electronic circuit element 13.

For a hermetic connection of the frame 5 and the glass element 8, it is in general particularly favorable for the frame to have a linear thermal expansion coefficient which is greater than the thermal expansion coefficient of the glass of the glass element 8. This applies in particular to the average value of the thermal expansion coefficient of the frame in relation to the average value of the thermal expansion coefficient of the glass element in a temperature interval of from 20° C. to the glass transition temperature $T_g$ of the glass element. The difference $\Delta\alpha$ of the thermal expansion coefficients may readily be up to $\Delta\alpha=7\cdot10^{-6}K^{-1}$. Preferably, the difference is $\Delta\alpha<3\cdot10^{-6}K^{-1}$. The difference of the thermal expansion coefficients assists the buildup of a compressive stress during the cooling after the melting and solidification of the glass element 8 in the frame 5. It is therefore favorable for the difference of the thermal expansion coefficients to be at least $\Delta\alpha=2\cdot10^{-6}K^{-1}$, preferably at least $\Delta\alpha=0.5\cdot10^{-6}K^{-1}$, most preferably at least $\Delta\alpha=0.1\cdot10^{-6}K^{-1}$.

Generally, in one particularly preferred embodiment, it is also provided to this end that the frame 5 then exerts a compressive stress on the glass element 8. Surprisingly, the formation of a suitable hermetically sealed connection is possible even with approximately equal or equal thermal expansion coefficients, i.e. matched glazing. Approximately equal or substantially equal thermal expansion coefficients $\alpha$ in this case also include a magnitude range of up to $|\Delta\alpha=1.0\cdot10^{-6}K^{-1}|$, preferably up to $|\Delta\alpha=0.1\cdot10^{-6}K^{-1}|$, i.e. a difference in magnitude of the thermal expansion coefficients of the frame and the glass element up to the aforementioned value of $1.0\cdot10^{-6}K^{-1}$, preferably up to $0.1\cdot10^{-6}K^{-1}$. Optionally, the thermal expansion coefficient of the glass in the scope of this difference in magnitude may also be either greater or less than the thermal expansion coefficient of the frame.

In order that the compressive stress presses the glass and the nitride ceramic onto one another at the interface, it is favorable to select the glass element not to be too thin in relation to its lateral dimensions. Otherwise, the compressive stress may be reduced by resilient bending of the glass element. Lateral, or sideways, dimensions in the range of from 2 mm to 20 mm are preferred. In the case of rectangular or square glass elements, these measurements are the longest side lengths. The diagonal measurements may correspondingly be longer. The average thickness of the glass element 8 preferably lies in the range of from 0.2 mm to 2 mm. Taking these measurements into account, the ratio of the average thickness of the glass element to the lateral, or sideways, dimension, i.e. in particular to the diameter or to the longest side length, is preferably less than 1/20, preferably less than 1/15. Shapes with a ratio of more than 1 are also conceivable, for instance when the glass element is configured as a thick lens or light guide. The frame 5 preferably has a minimum thickness in order to improve the heat transport. A minimum thickness is also advantageous for building up high compressive stresses. According to one embodiment of the invention, the frame has a thickness, or wall thickness, in the range of from 0.5 mm to 2 mm. In general, without restriction to the example represented, a cap 2 according to this disclosure may have one or more of the aforementioned features in relation to the dimensions and dimension ratios.

In the example shown in FIG. 3, the opening has a square shape. The hermetic connection of the glass to the nitride ceramic is in this case generally also thereby facilitated if the opening 7 has rounded corners 14 in the case of an angular or polygonal shape. It is in this case furthermore particularly preferred for the radius of the rounded corners to be more than 0.05 mm. Advantageously, the radius is at least 0.2 mm. Without restriction to the square shape shown in FIG. 3, the opening 7 may also have round, elliptical and/or other nonround shapes i.e. including an angular or polygonal shape, particularly in order to suit the geometry or the geometrical specifications of an optoelectronic component 1.

In order to connect the cap 2 and the carrier 10 to one another in order to produce an optoelectronic component 1, soldering of the two parts is suitable. FIG. 1 represents the connection of the cap 2 and the carrier 10 by means of a metal solder 19. The solder connects well to the nitride ceramic and furthermore has a high thermal conductivity, so that a low thermal resistance is provided at the transition between the carrier 10 and the cap 2.

The cap 2 according to this disclosure may be produced by a method in which a frame 5 made of a nitride ceramic, which has an opening 7, is provided, and wherein a glass part or glass preform is brought together with the frame 5 so that the opening 7 in the frame 5 is closed, and wherein the glass preform 6 is isothermally heated together with the frame 5 so that the glass of the glass preform softens and fuses onto the frame 5.

Figure 7:
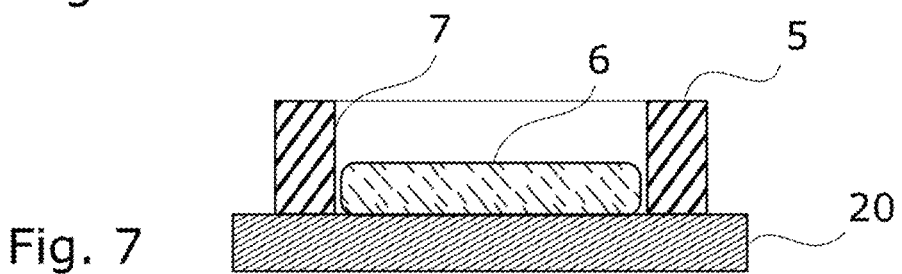
FIG. 7 shows the frame of the cap and a glass preform with a mold part for shaping the glass preform before the connection.

Particularly preferably, the fusion of the glass preform to form the glass element 8 that closes the opening 7 is carried out in a continuous oven. The method steps according to preferred configurations will be explained in more detail below with reference to the purely exemplary drawings. FIG. 7 in this regard shows the frame 5 and a glass preform 6, which is intended to be fused to the frame 5 in order to form the cap 2. To this end, the frame 5 is placed onto a mold part 20 and the glass preform 6 is placed into the opening 7 of the frame 5. The upper side of the mold part 20 is used as a shaping surface for the glass preform 6. In the simplest case, the shaping surface is planar in order to form a planar outer surface of the glass element 8.

Figure 8:
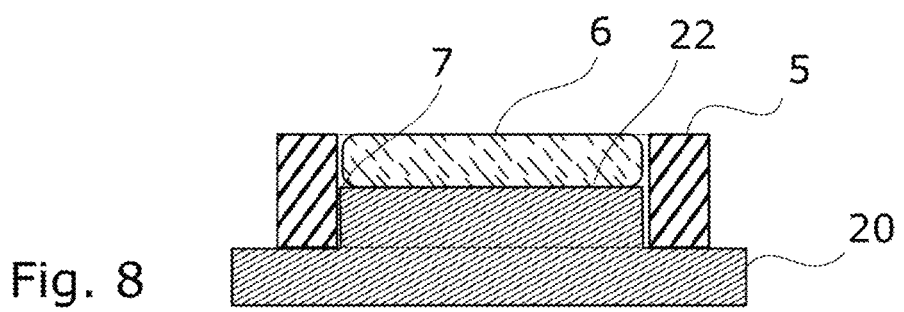
FIG. 8 shows an alternative embodiment of the arrangement of FIG. 7.
Figure 9:
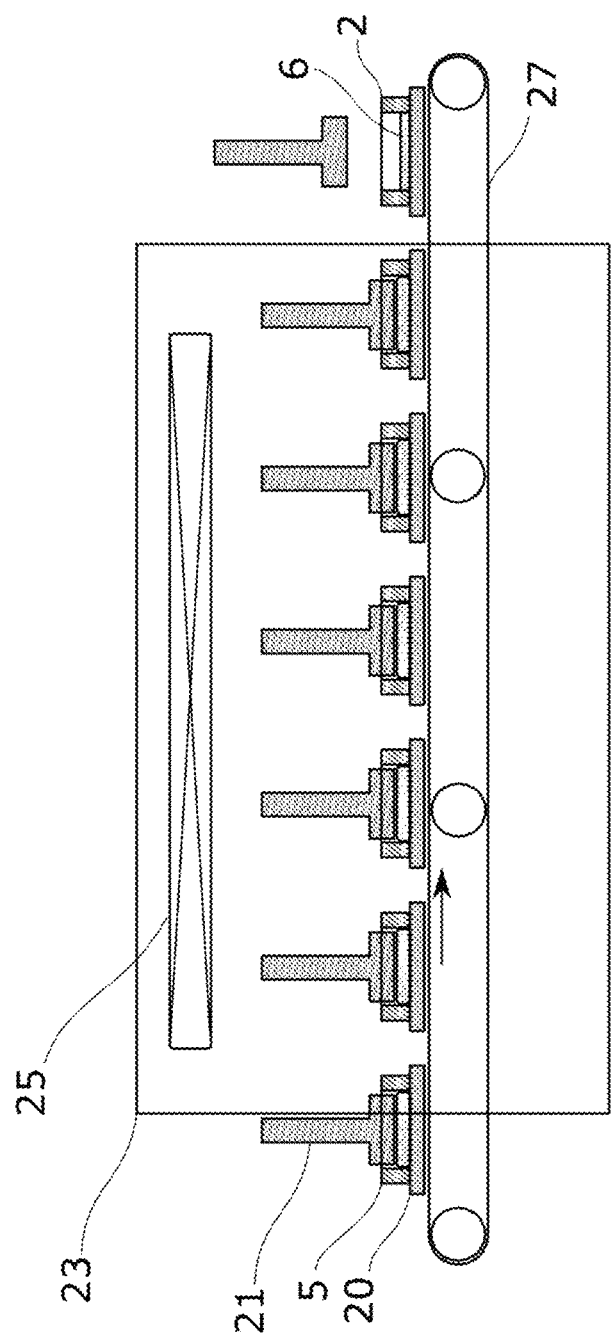
FIG. 9 shows a continuous oven for fusing the glass element onto the frame.

FIG. 9 shows an alternative embodiment of the arrangement shown in FIG. 8. Here, the mold part 20 is configured as a die, the die surface 22 of which protrudes into the frame 5 when the latter is placed on. The glass preform 6 is placed into the frame 5 as in the arrangement of FIG. 8. The glass preform 6 now, however, bears on the inner side on the mold part 20.

In one refinement of the method, it is provided that the fusion of the glass preform 6 to the frame 5 is carried out in a continuous oven. FIG. 9 in this regard shows a continuous oven 23 having one or more heating elements 25. The mold parts 20 with the frames 5 placed on and the glass preforms 6 placed into the openings 7 of the frames 5, in particular as shown in FIG. 7 or FIG. 8, are for example conveyed through the continuous oven 23 on a conveyor belt 27. The continuous oven may in particular comprise zones with different temperatures, temperature gradients, speeds and/or oven atmospheres.

In order also to shape the inner side 17 of the glass element 8 produced from the glass preform 6 in a controlled way, according to a further preferred configuration of the method, it is provided that a die 21 is pressed onto the glass preform 6 so that the glass yields to the pressure of the die 21 when softening and is pressed onto the wall of the opening 7. In this case, the surfaces of the glass element 8 are simultaneously shaped according to the surfaces of the die 21 and the mold part 20. It is therefore possible not only to form planar disk-shaped glass elements 8. The example shown in FIG. 1 also already shows a slightly biconvex shape. With the method, during the production of the cap 2, it is thus correspondingly possible to shape glass elements that act as optical elements, such as lenses, prisms or coupling elements, such as for instance light guides. Furthermore, the application of a pressure has a positive effect overall, but particularly when there are substantially equal thermal expansion coefficients of the glass element 8 and the frame 5, on the formation of an interlock between the glass element 8 and the frame 5.

If, as is preferably provided, the linear thermal expansion coefficient of the frame 5 is greater than the linear thermal expansion coefficient of the glass element 8, a compressive stress acting on the glass element 8 is built up during the combined cooling after falling below the glass transition temperature of the glass element, since the frame 5 contracts more strongly than the glass element 8. This compressive stress presses the nitride ceramic and the glass onto one another at the interface 57. Particularly by this mechanism, on the one hand, and the surface structures fitting together exactly due to the fusing, hermetic sealing is achieved even in the case of superphobic material pairings.

LIST OF REFERENCES

| | |
|---|---|
| 1 | optoelectronic component |
| 2 | cap |
| 5 | frame |
| 6 | glass preform |
| 7 | opening in 5 |
| 8 | glass element |
| 10 | carrier |

-continued

| 11 | cavity |
| 13 | electronic circuit element |
| 14 | corners of 7 |
| 17 | inner side of 8 |
| 19 | solder |
| 20 | mold part |
| 21 | die |
| 22 | die surface |
| 23 | continuous oven |
| 25 | heating element |
| 27 | conveyor belt |
| 57 | interface between frame 5 and glass element 8 |
| 60 | shoulder |

What is claimed is:

1. A cap for a package of an optoelectronic component, comprising:
a frame made of a nitride ceramic, the frame has an opening; and
a glass element that hermetically closes the opening, the glass element is fused onto the nitride ceramic and is fixed in contact with the nitride ceramic of the frame, wherein the glass element and the frame have interface surfaces that directly bear on one another with complementary structures along an entirety thereof, and wherein the glass element is fused into the opening with the complementary structures of the glass element and the frame interlocking and with the glass element connected to an inner wall of the opening so that the inner wall encloses the glass element on a circumference of the glass element and hermetically seals a transition between the frame and the glass element.

2. The cap of claim 1, wherein the glass element further comprises an open cavity on an inner side.

3. The cap of claim 1, wherein the frame comprises aluminum nitride.

4. The cap of claim 1, further comprising a contact angle between a glass of the glass element and the nitride ceramic of the frame that is more than 90°.

5. The cap of claim 1, wherein the frame has a linear thermal expansion coefficient that is greater than or equal to a thermal expansion coefficient of a glass of the glass element.

6. The cap of claim 1, wherein the frame has an average value of a thermal expansion coefficient in a temperature interval of from 20° C. to a glass transition temperature ($T_g$) of a glass of the glass element that is greater than or equal to an average value of a thermal expansion coefficient of the glass of the glass element.

7. The cap of claim 1, further comprising a difference between a thermal expansion coefficient of the frame and a thermal expansion coefficient of a glass of the glass element that is at least $\Delta\alpha=0.1\cdot10^{-6}K^{-1}$ and up to $\Delta\alpha=7\cdot10^{-6}K^{-1}$.

8. The cap of claim 7, wherein the difference is at least $\Delta\alpha=0.5\cdot10^{-6}K^{-1}$.

9. The cap of claim 7, wherein the difference is at least $\Delta\alpha=2\cdot10^{-6}K^{-1}$.

10. The cap of claim 1, wherein the glass element comprises a glass having a bismuth content of less than 5 wt % at least where the glass element interfaces with the frame.

11. The cap of claim 1, wherein the glass element comprises a glass having a bismuth content of less than 2 wt % at least where the glass element interfaces with the frame.

12. The cap of claim 1, wherein the opening has a shape selected from a group consisting of round, nonround, angular, polygonal, angular with rounded corners, and polygonal with rounded corners.

13. The cap of claim 1, wherein the frame exerts a compressive stress on the glass element.

14. The cap of claim 1, further comprising a feature selected from a group consisting of: a lateral dimension of the glass element that lies in a range of from 2 mm to 20 mm; an average thickness of the glass element that lies in a range of from 0.2 mm to 2 mm; a ratio of an average thickness of the glass element to a lateral dimension of the glass element that is less than 1/20; a wall thickness of the frame that is in a range of from 0.5 mm to 2 mm; a shoulder of the frame that is in contact with the glass element; a granularity of the nitride ceramic that has an average grain diameter in a range of from 1 to 10 μm; and a radius of rounded corners in the opening of the frame that are more than 0.05 mm.

15. An optoelectronic component, comprising:
a carrier;
an electronic circuit element on the carrier; and
a frame made of a nitride ceramic and a glass element that hermetically closes an opening in the frame, the glass element is fused onto the nitride ceramic and is fixed in contact with the nitride ceramic of the frame, wherein the frame and glass element together form a cap,
wherein the cap is on the carrier and connected thereto so that the electronic circuit element is enclosed and hermetically encapsulated in a cavity formed between the cap and the carrier,
wherein the glass element forms a translucent window to the cavity with a gap between the electronic circuit element and the glass element,
wherein the glass element and the frame have interface surfaces that directly bear on one another with complementary structures along an entirety thereof, and
wherein the glass element is fused into the opening with the complementary structures of the glass element and the frame interlocking and with the glass element connected to an inner wall of the opening so that the inner wall encloses the glass element on a circumference of the glass element and hermetically seals a transition between the frame and the glass element.

16. A cap for a package of an optoelectronic component, comprising:
a frame made of a nitride ceramic having a first thermal expansion coefficient, the frame having an opening;
a glass element that hermetically closes the opening, the glass element comprising a glass having a second thermal expansion coefficient, the glass element being fused onto the nitride ceramic and being fixed in contact with the nitride ceramic of the frame, wherein the glass element and the frame have interface surfaces that directly bear on one another with complementary structures along an entirety thereof, wherein the complementary structures of the glass element and the frame interlock; and
a difference between the first thermal expansion coefficient and the second thermal expansion coefficient is at least $\Delta\alpha=0.1\cdot10^{-6}K^{-1}$ and up to $\Delta\alpha=7\cdot10^{-6}K^{-1}$.

* * * * *